United States Patent
Zengerle

(10) Patent No.: US 6,213,327 B1
(45) Date of Patent: Apr. 10, 2001

(54) CONTAINER FOR A RAIL VEHICLE FOR THE INSTALLATION OF ELECTRONIC AND ELECTRICAL EQUIPMENT

(75) Inventor: Manfred Zengerle, Ebertsheim (DE)

(73) Assignee: DaimlerChrysler Rail Systems (Technology) GmbH, Berlin (DE)

( * ) Notice: Subject to any disclaimer, the term of this patent is extended or adjusted under 35 U.S.C. 154(b) by 0 days.

(21) Appl. No.: 09/350,350

(22) Filed: Jul. 14, 1999

(30) Foreign Application Priority Data

Jul. 21, 1998 (DE) ............................................. 198 32 740

(51) Int. Cl.[7] ....................................................... B65D 6/00
(52) U.S. Cl. ......................... 220/4.02; 220/4.21; 220/4.26
(58) Field of Search ................. 220/4.02, 4.21, 220/4.26, 3.3

(56) References Cited

U.S. PATENT DOCUMENTS

| | | | |
|---|---|---|---|
| 3,950,603 | * | 4/1976 | Brefka ............................ 220/4.21 X |
| 4,111,328 | * | 9/1978 | Eggert et al. .................... 220/4.26 X |
| 4,202,457 | * | 5/1980 | Tansi ................................... 220/3.3 |
| 4,944,420 | * | 7/1990 | Adkins et al. ......................... 220/3.3 |
| 5,303,823 | * | 4/1994 | Niles et al. ..................... 220/4.21 X |
| 5,398,833 | * | 3/1995 | Klauss et al. ....................... 220/4.02 |
| 5,660,297 | * | 8/1997 | Liu ..................................... 220/4.02 |

FOREIGN PATENT DOCUMENTS

| | | |
|---|---|---|
| 24 24 722 B2 | 5/1974 | (DE) . |
| 86 11 965 | 3/1986 | (DE) . |
| 195 45 448 | 6/1995 | (DE) . |
| 197 09 460 | 3/1997 | (DE) . |

* cited by examiner

*Primary Examiner*—Steven Pollard
(74) *Attorney, Agent, or Firm*—Woodcock Washburn Kurtz Mackiewicz & Norris LLP

(57) ABSTRACT

A container for a rail vehicle for the installation of electric and electronic equipment is proposed. The container (1) is formed from an extruded section (2, 3) bent in the edge regions (10) and provided with lid (22) and rear panel (21). The extruded section used for forming the wall has a special structure adopted exactly to the requirements of the container (1) and having at least one coolant duct (13) of closed cross section. A cooling circuit within the equipment is formed by means of the cooling ducts, in which case the coolant may be pressurized. The thermal energy produced and radiated in components installed individually in the interior space of the container (1) is absorbed by the cooling circuit within the equipment and is dissipated via the surface of the container to the outside atmosphere.

9 Claims, 4 Drawing Sheets

Figure 1:
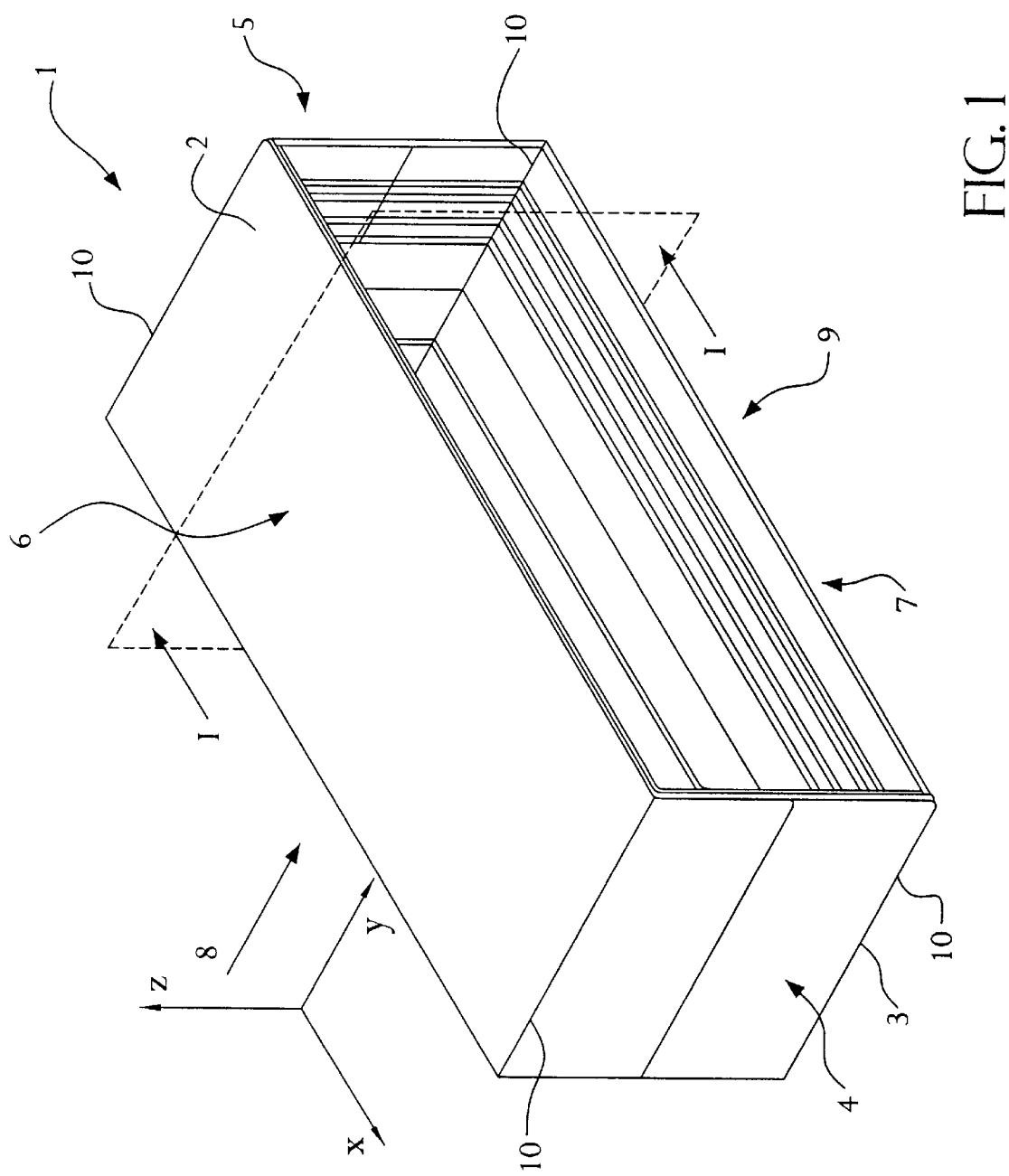

CONTAINER FOR A RAIL VEHICLE FOR THE INSTALLATION OF ELECTRONIC AND ELECTRICAL EQUIPMENT

The invention relates to a container for a rail vehicle for the installation of electrical and electronic equipment according to the preamble of claim 1. The container according to the invention may be used in particular for accommodating converter equipment.

In the case of rail vehicles, in particular in the case of short-distance vehicles, it is generally known to install converter equipment and associated components in a container, which is fitted in the underfloor region, in the roof region or in a machinery space of the vehicle. The generally known containers are composed of individual metal sheets, in which case costly constructions are necessary in order to ensure the requisite mechanical stability and tightness against moisture and dust.

DE 2424722 B2 discloses a casing for equipment in electrical metrology and telecommunications engineering, in which casing a shell, consisting of the side parts, the casing base and the top side, or a part of the shell is formed from strip. The strip has transverse slots, which reduce the strip thickness down to a small material web and subdivide the strip into strip sections. The strip can be angled in the region of the transverse slots, so that the material webs form casing edges. Furthermore, the strip has continuous longitudinal slots in order to accommodate and retain plate-shaped subracks at the margins, the subracks being arranged between a front plate and a rear panel of the casing. A disadvantage with this known casing is the poor dissipation of the heat which is generated by the electronic components and which in turn impairs the operability of the components. Furthermore, the cabling of the plate-shaped subracks is difficult, since only a little space is available for the cables.

DE 19709460 A1 discloses an outdoor casing for accommodating electronic components, which outdoor casing is composed of an inner casing structure, which encloses the components in a hermetically tight manner, and an outer csing structure, which, with a cavity being formed, is arranged on the inner casing structure. The outer casing structure is formed by hollow-section rails, which are detachably fastened to the inner casing structure. Even though the cavity helps to cool the components, the heat dissipation is still insufficient. In addition, the requisite compactness or small overall size which is necessary for the fitting of the casing in the underfloor or roof region of a rail vehicle is not achieved with the known outdoor casing. In addition, the known type of construction leads to low mechanical stability of the entire casing.

The object of the invention is therefore to specify a container for a rail vehicle for the installation of electrical and electronic equipment of the type mentioned at the beginning which permits improved heat dissipation and nonetheless has the requisite compactness and mechanical stability and tightness against moisture and dust, in which case simple wiring of the electronic components located in the container is to be made possible at the same time.

In combination with the features of the preamble, this object is achieved according to the invention by the features specified in the defining part of claim 1.

The advantages achievable with the invention consist in particular in the fact that, by the integration of a coolant duct of closed cross section in the extruded section, a very compact construction of the container with at the same time cooling of the components is achieved. The container according to the invention may be installed both in the underfloor region of the rail vehicle and in the roof region as well as in the machinery space and can be handled in an extremely flexible manner with regard to the desired dimensioning (length/breadth/height).

Furthermore, a closed cooling duct which encompasses the container is obtained after the bending of the extruded section. A cooling circuit within the equipment is formed by means of the cooling ducts, in which case the coolant may be pressurized, so that the heat dissipation is intensified.

A further advantage achievable with the invention consists in the fact that additional welding or screwing pionts are omitted due to the bending of the extruded section in the edge regions, which additional welding or screwing points entail the risk of leakages from the interior space of the casing to the environment, as a result of which contaminants are introduced and corrosion is promoted. In addition, the desired high mechanical strength of the container on account of the use of the extruded section having closed cross sections can be achieved at comparatively low cost, in particular when a welded casing composed of individual conventional sheet-metal parts is used by way of comparison. Even in the case of a very flat type of construction, very high mechanical rigidity is obtained. Since only a few welding points are necessary or since welding work may be largely dispensed with if suitable angle pieces are used In the edge region, only very little distortion results during assembly.

Figure 2:
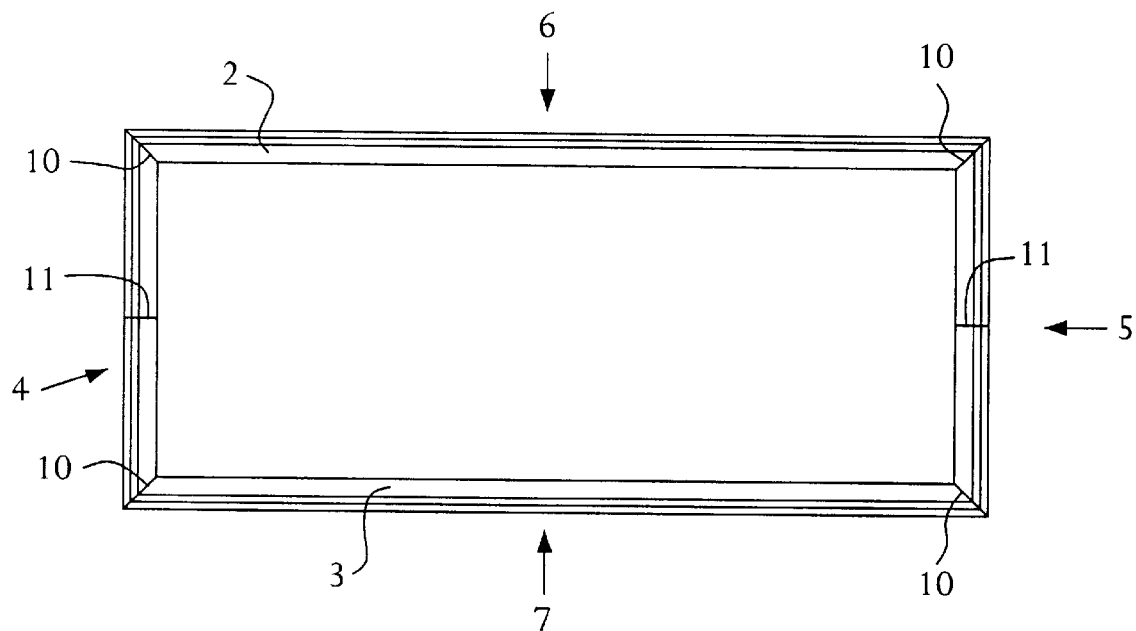
Figure 3:
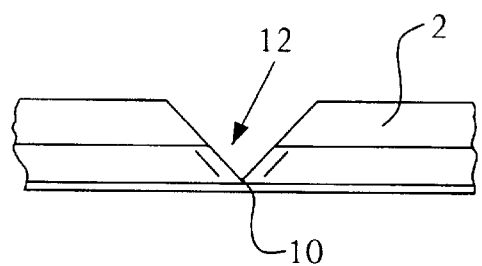
Figure 4:
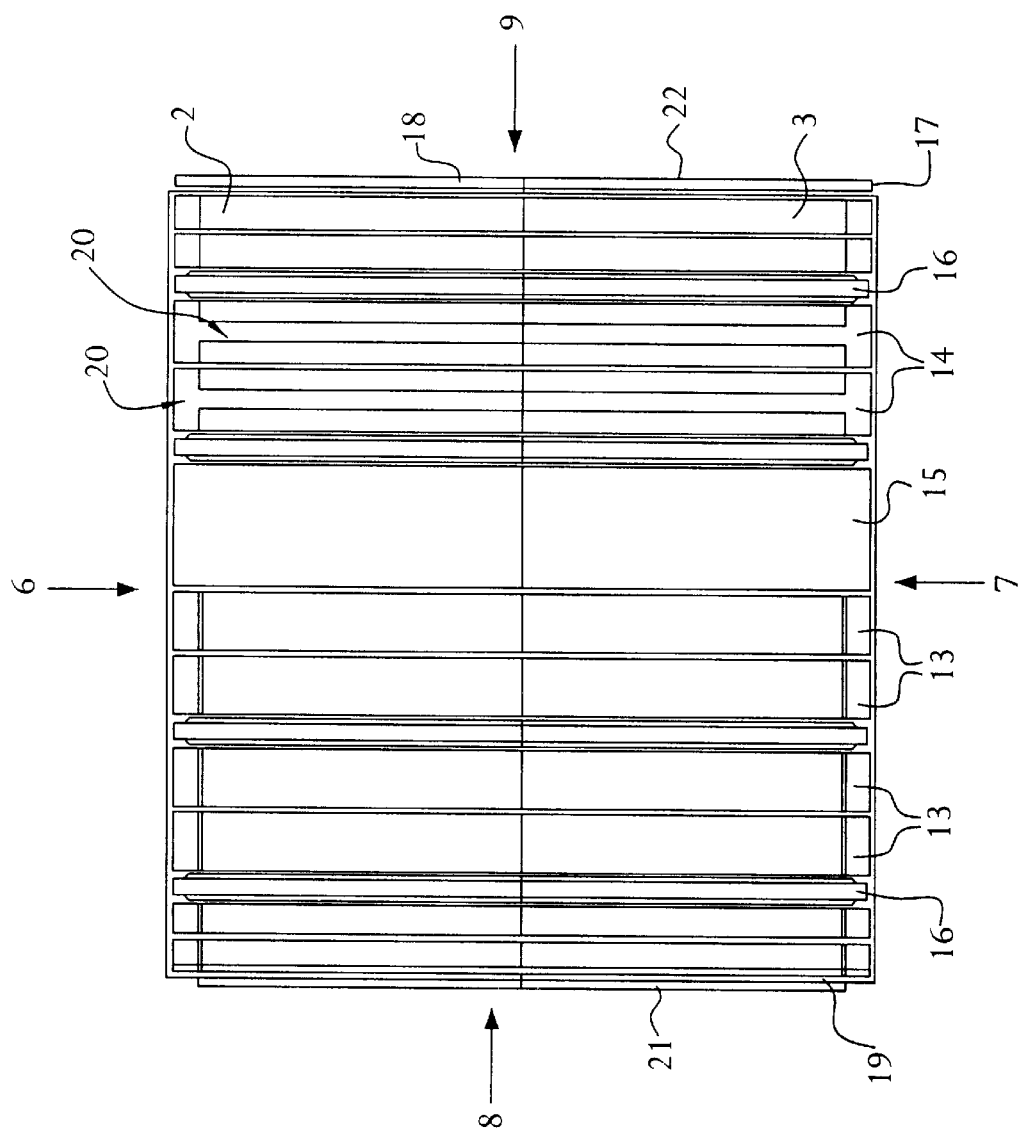
Figure 5:
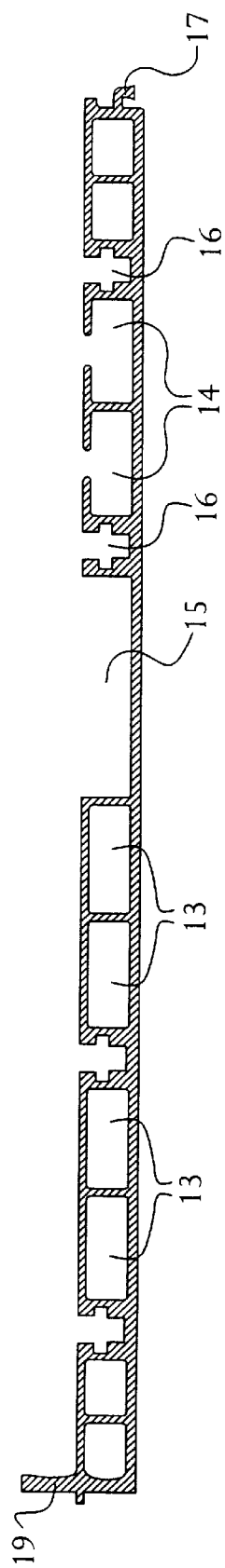

The invention is explained in more detail below with reference to the exemplary embodiments shown in the schematic drawing, in which:

FIG. 1 shows a perspective representation of the container according to the invention without lid and rear panel, FIG. 2 shows a front view of the container of FIG. 1, FIG. 3 shows a detail of the side view of an extruded section before the bending, FIG. 4 shows a section along section plane I in FIG. 1 through the container according to the invention with lid and rear panel, and FIG. 5 shows a section through the extruded section for producing the container according to the invention.

FIG. 1 shows a perspective representation of the container according to the invention. The container 1 is composed of four main components, namely a top part 2, a bottom part 3, a rear panel 21 and a lid 22, the latter two components being shown in FIG. 4. The top part 2 together with the bottom part 3 forms the side surfaces 4 and 5 as well as the top and base surfaces 6 and 7 of the container 1. The rear panel 21 and the lid 22 respectively are formed from flat metal sheets, preferably of aluminum, and close the rear side 8 and the front side 9 respectively of the container 1. The top part 2 as well as the bottom part 3 consist of a special extruded aluminum section, which is described in more detail below. In a smaller design of the container, a variant in which the top part 2 and bottom part 3 are combined to form a single part may also be used. In both the one-piece design and the two-piece design, in which bottom part and top part 2, 3 are provided, the extruded aluminum sections are preferably not joined in the edge region 10 but along a side surface 4, 5.

A front view of the container of FIG. 1 is shown in FIG. 2. Both the top part 2 and the bottom part 3 are each bent in one piece in a U-shape. As can be seen, the extruded aluminum sections must first be machined and then bent through 90° in order to permit the angled configurations, in each case at right angles, in the edge regions 10. To achieve the desired mechanical stability, the edge regions are preferably welded or screwed with the use of suitable angle pieces. The top part 2 and bottom part 3 are joined at their end faces 11, preferably by welding, the end faces 11 being arranged in the region of the side faces 4, 5.

To this end, taking the top part 2 as an example, the machining of the extruded aluminum section for creating an edge region 10 is shown in FIG. 3. The extruded aluminum sections are provided with a right-angled, V-shaped notch 12, preferaby by milling, in the edge regions 10 transversely to the extruding direction right down to the thickness of the basic material.

FIG. 4 shows a section through the container of FIG. 1 along section plane I. The extruded aluminum section used for forming the side surfaces 4, 5, the top surface 6 and the base surface 7 has a special structure adapted exactly to the requirements of the container 1 and having at least one coolant duct 13, at least one cable duct 14, at least one duct 15 for accommodating conductor rails, at least one slot 16 for fastening intermediate walls within the casing, a lid-side edge 17 for attaching a lid hinge, a lid-side sealing collar 18 and a rear-panel-side flange 19.

The at least one coolant duct 13 is provided with a closed cross section and is preferably continuously connected at the edge regions 10, in which case the sealing in the edge region 10, with the use of air as coolant, may be effected by means of silicone. When cooling fluid at a predetermined pressure is used, the coolant duct 13 is connected in a coolant-tight manner by welding. A cooling circuit within the equipment, referably an air-cooling circuit, is formed by means of the coolant ducts 13. The thermal energy produced and radiated in components installed individually in the interior space of the container is absorbed by the cooling circuit within the equipment and is dissipated via the surface of the container to the outside atmosphere. In this way, inadmissably high temperatures are prevented from occurring within the container 1.

The at least one cable duct 14 has a continuous opening 20 directed toward the interior space of the container and in this way permits the insertion and running of electrical lines which are to be laid inside the container 1 between the individual components.

The lug-shaped, encircling sealing collar 18 presses against a sealing profile, which is inserted in the lid 22 and is made, for example, of rubber. A very good sealing effect is achieved in this way.

The encircling flange 19, on the one hand, serves to fasten the rear panel 21, an inserted sealing profile preferably being provided for the sealing of the interior space of the casing; on the other hand, the forces of the installed components are directed into the casing structure via this flange 19.

FIG. 5, in an enlarged representation, shows the extruded section for producing the container 1. In particular, the coolant ducts 13, the cable ducts 14, the duct 15 for accommodating conductor rails, the slots 16 for fastening intermediate walls within the casing, the lid-side edge 17 for attaching a lid hinge, and the rear-panel-side flange 19 can be seen.

What is claimed is:

1. A container for a rail vehicle for the installation of electrical and electronic equipment, the container comprising:

a top part and a bottom part, each part having a length of U-shaped cross section, bent at a right angle in each of two edge regions, the top part having a top surface extending between the edge regions of the top part, the bottom part having a base surface extending between the edge regions of the bottom part, the top part and bottom part oriented such that the top surface is parallel to the base surface defining an interior of the container therebetween, each part having an extruded section having a cross section that extends the length of each part, wherein the extruded section has at least one coolant duct having a closed cross section; and a lid and a rear panel, each extending between an edge region of the top part and a more proximate edge region of the bottom part, wherein the right angle of each edge region is formed by:
cutting a right angle V-shaped notch into the cross section of the extruded section, the notch having a length extending the length of the extruded section; and
bending the extruded section so as to close the V-shaped notch, thereby forming the right angle of the edge region.

2. The container as claimed in claim 1, wherein the extruded section further has at least one cable duct having an opening directed toward the interior of the container.

3. The container as claimed in claim 1, wherein the extruded section further has an encircling lid-side sealing collar, which presses against a sealing profile of the lid for sealing the lid.

4. The container as claimed in claim 1, wherein the extruded section further has a rear-panel-side encircling flange for fastening and sealing the rear panel.

5. The container as claimed in claim 1, wherein the extruded section further has at least one slot for fastening an intermediate wall within the container.

6. The container as claimed in claim 1, wherein the extruded section further has at least one duct for accommodating conductor rails.

7. The container as claimed in claim 1, wherein the extruded section further has a lid-side edge (17) for attaching a lid hinge.

8. The container as claimed in claim 1, wherein the top part further has two side surfaces, each extending from the edge region of the top part in a direction perpendicular to and away from the top surface, and the bottom part further has two side surfaces, each extending from the edge region of the bottom part in a direction perpendicular to and away from the base surface, the top part and bottom part being joined to one another at end faces of their respective side surfaces.

9. The container as claimed in claim 1, wherein for the right angle of each edge region, the V-shaped notch extends into the cross section of the extruded section down to an outermost layer of the extruded section, the outermost layer being defined with respect to the interior of the container.

* * * * *